United States Patent [19]
Arakawa

[11] Patent Number: 4,800,533
[45] Date of Patent: Jan. 24, 1989

[54] SEMICONDUCTOR NONVOLATILE MEMORY DEVICE

[75] Inventor: Hideki Arakawa, Yokohama, Japan

[73] Assignee: Fujitsu Limited, Kanagawa, Japan

[21] Appl. No.: 43,791

[22] Filed: Apr. 29, 1987

[30] Foreign Application Priority Data

Apr. 30, 1986 [JP] Japan .................. 61-097985

[51] Int. Cl.$^4$ ............................................. G11C 17/00
[52] U.S. Cl. ...................................... 365/228; 365/226
[58] Field of Search ............... 365/226, 228, 229, 154, 365/190

[56] References Cited

U.S. PATENT DOCUMENTS 4,638,465  1/1987  Rosini et al. .................... 365/228

FOREIGN PATENT DOCUMENTS

60-083374   5/1985  Japan .
60-185294   9/1985  Japan .
60-185295   9/1985  Japan .
60-185296   9/1985  Japan .
60-185297   9/1985  Japan .
60-185298   9/1985  Japan .
60-185299   9/1985  Japan .
61-113189   5/1986  Japan .
61-117794   6/1986  Japan .
61-246995  11/1986  Japan .

Primary Examiner—Joseph A. Popek
Attorney, Agent, or Firm—Armstrong, Nikaido, Marmelstein & Kubovcik

[57] ABSTRACT

A semiconductor nonvolatile memory device includes a plurality of nonvolatile random access memory cells constituted by volatile memory cells and nonvolatile erasable programmable read only memory cells. A sense circuit senses a level of potential of a power source, and based on the sensed level, selects a store operation or a recall operation. Also included are a first terminal for the power source and a second terminal for an auxiliary power source. The detection of a rise or fall of the potential at the first terminal is carried out in the sense circuit and based on the result of the potential detection, a data transmission from the volatile random access memory cell to the nonvolatile erasable programmable read only memory cell or from the nonvolatile erasable programmable read only memory to the volatile random access memory is automatically carried out.

8 Claims, 7 Drawing Sheets

SEMICONDUCTOR NONVOLATILE MEMORY DEVICE

BACKGROUND OF THE INVENTION

1. Field of the Invention

The present invention relates to a semiconductor nonvolatile memory device. More particularly, the present invention is related to a memory device in the form of a nonvolatile RAM (NVRAM), in which a volatile memory, for example, a static random access memory (SRAM) or dynamic random access memory (DRAM) and an electrically erasable and programmable read only memory (EEPROM or E$^2$PROM) are combined on a one to one basis.

2. Description of the Related Art

In general, a memory cell array of an NVRAM is composed of a number of memory cell units in which an SRAM cell and an EEPROM cell are combined, and before the power source is turned OFF, the content of the SRAM cell is transferred to the EEPROM cell, thus rendering the device nonvolatile.

That is, when the power source is ON, the SRAM carries out a read/write operation as a conventional SRAM, and before the power source is turned OFF, the data in the SRAM is written into the EEPROM, and utilizing the nonvolatile characteristic, data is held therein while the power source is OFF. When the power source is again switched ON, the data in the EEPROM is recalled to the SRAM and a conventional read/write operation carried out.

To control such a currently used NVRAM, the following method is utilized.

For example, when two sorts of signals, i.e., a store signal $\overline{ST}$ (inverted ST) and a recall signal $\overline{RC}$ (inverted RC), are used, and a store signal $\overline{ST}$ falls to a LOW level, the content of the SRAM is transferred to the EEPROM. Conversely, when a recall signal $\overline{RC}$ falls to a LOW level, the content of the EEPROM is transferred to the SRAM.

A nonvolatile enable signal $\overline{NE}$ (inverted NE) is combined with a respective signal between a write enable signal $\overline{WE}$ (inverted WE), a chip enable signal $\overline{CE}$ (inverted CE) and an output enable signal $\overline{OE}$ (inverted OE), to realize either the above-noted store signal mode or recall mode and therefore, a control pin must be utilized for this procedure.

SUMMARY OF THE INVENTION

It is an object of the present invention to provide an improved semiconductor nonvolatile memory device in which the use of a specified control signal for the control of a store operation is unnecessary.

Therefore, in accordance with the present invention, there is provided a semiconductor nonvolatile memory device including: a plurality of nonvolatile random access memory cells constituted by volatile memory cells and nonvolatile erasable programmable read only memory cells; a sense circuit for sensing the level of the potential of a power source, and based on the sensed level, selecting a store operation or a recall operation; and a first terminal for the power source and a second terminal for an auxiliary power source; wherein the detection of a rise or fall of the potential at the first terminal is carried out in the sense circuit, and based on the result of the potential detection, a data transmission from the nonvolatile random access memory cell to the nonvolatile erasable programmable read only memory cell or from the nonvolatile erasable programmable read only memory to the nonvolatile random access memory is automatically carried out.

DESCRIPTION OF THE PREFERRED EMBODIMENTS

Figure 1:
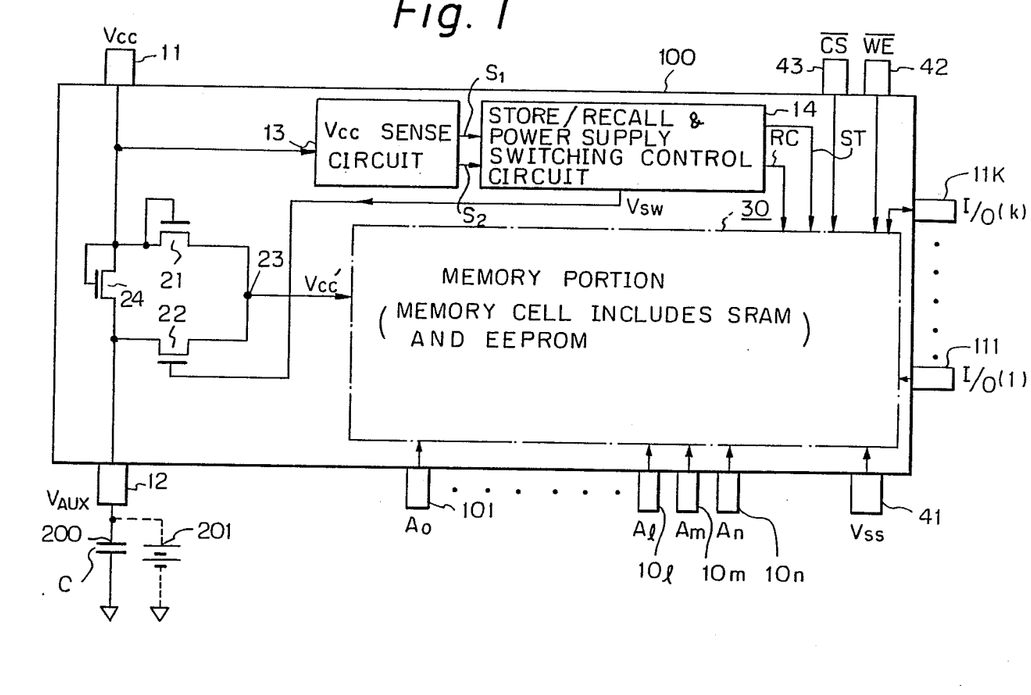
FIG. 1 is a block diagram of the fundamental structure of a semiconductor nonvolatile memory device according to an embodiment of the present invention.

The fundamental structure of a semiconductor nonvolatile memory device according to an embodiment of the present invention is shown in FIG. 1. The device of FIG. 1 includes a semiconductor nonvolatile memory device 100, a power source back-up capacitor 200, N channel MOS transistors 21, 22 and 24, a positive side power source potential level V$_{CC}$, an auxiliary power source V$_{AUX}$, a pin terminal 11 for the positive side power source, a pin terminal 12 for the auxiliary power source, a node 23 of a common power source or an inner power source, a sense circuit 13 for sensing the positive side power source potential level V$_{CC}$, and a switching-over control circuit 14 for generating a store/recall signal and controlling the transistor 22. The output of the switch-over control circuit 14, i.e., a store signal or a recall signal, is sent to a memory portion 30. The semiconductor nonvolatile memory device 100 includes address input pin terminals 10l–10n receiving address signals A$_0$–A$_l$, A$_m$, A$_n$; a pin terminal 41 receiving a negative side power source potential level V$_{SS}$; data input/output pin terminals 11L–11K receiving input/output data I/O(l)–I/O(k); and a pin terminal 43 receiving a chip select signal $\overline{CS}$, a pin terminal 42 receiving a write enable signal $\overline{WE}$ other than the pin terminals 11 and 12. A battery 201 is connected to pin terminals 11 and 12 in place for a capacitor 200, when a transistor 24 is not connected between the terminals 11 and 12.

Figure 2A:
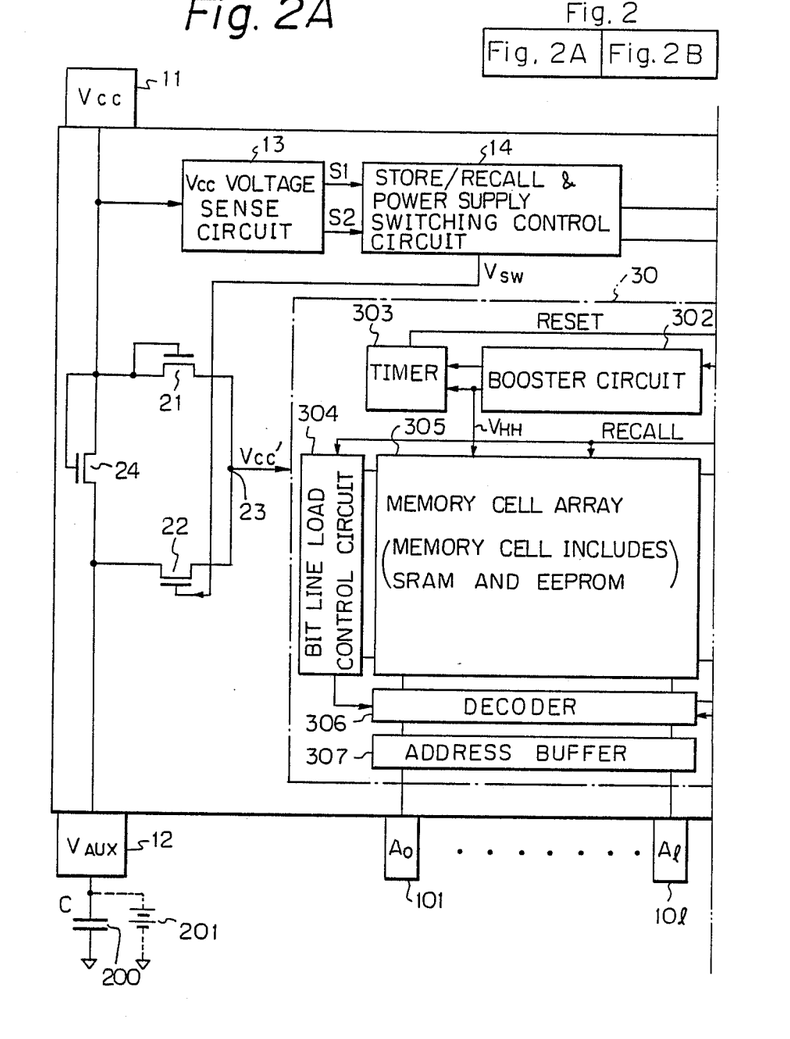
FIG. 2 shows the arrangement of the device of FIG. 1 in detail.
Figure 2B:
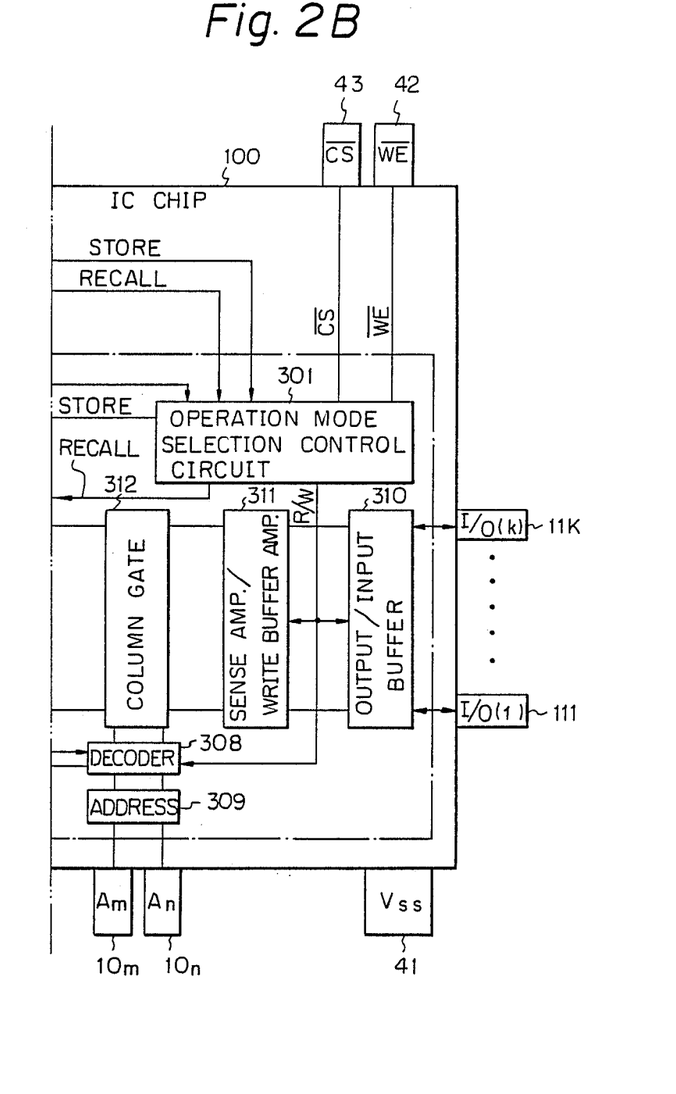

The arrangement of the device shown in FIG. 1 is shown in detail in FIG. 2.

In the device of FIGS. 1 and 2, in a normal operation a positive side power source potential V$_{CC}$ is applied to the pin terminal 11 as the positive side power source. The positive side power source potential level V$_{CC}$ is applied through the diode-connected transistor 21 as an internal power source V$_{CC}'$ to memory portion 30, and further applied to the back-up capacitor 200 through the transistor 24 and the auxiliary power source pin terminal 12, voltage V$_{CC}$ is also supplied from the pin terminal 11 to the V$_{CC}$ sense circuit 13. In the normal state, the voltage is supplied to each point of the semiconductor nonvolatile memory device from the internal power source, and thus the device can carry out a normal read/write operation. During the normal state, a signal for cutting off the transistor 22 is sent from the store/recall & power supply switching control circuit 14, and the power source back-up capacitor 200 is charged through the transistor 24.

When the power source is turned OFF and the positive side power source potential level $V_{CC}$, for example 4.5 to 5 volts, is reduced from 3 volts to 2 volts, the variation is detected immediately at the $V_{CC}$ voltage sense circuit 13 at the positive side power source, and a store/recall & power supply switching control circuit 14 then outputs a store signal ST, to transfer the content of a SRAM to an EEPROM. At the same time, a transistor 22 is turned ON and the voltage of the potential level $V_{AUX}$ (nearly equal to 4.5 through 5 volts) from the capacitor 200 is supplied as the internal power source at the node 23, thus backing-up the store operation. As the voltage $V_{CC}$ reduces, the transistors 21 and 24 are turned OFF. Responding to the store signal, a write high voltage $V_{HH}$ is produced and a store operation is carried out.

When the power source is switched ON, the potential level $V_{AUX}$ of the power source back-up capacitor 200 is 0 volt at the beginning and the positive side power source potential level $V_{CC}$ is also 0 volt. This potential level then rises gradually, and when the potential level reaches from 3 volts to 4 volts, the positive side power source potential level $V_{CC}$ sense circuit 13 outputs a recall signal, thus transferring the content of the EEPROM to the SRAM. The transfer will be completed by the time the positive side power source potential level $V_{CC}$ reaches 4.5 volts.

The capacitance of the power source back-up capacitor is determined as follows. Transistor 22 is turned OFF and transistors 21 and 24 are turned ON. Then, in response to a recall signal, an undermentioned transistor T5 is turned ON, the voltages $V_{C1}$ and $V_{C2}$ are applied in a predetermined sequence, to carry out a recall operation. Suppose that it takes 10 ms for the store operation and the store operation is finished during the time that the potential level $V_{AUX}$ of the power source back-up capacitor is reduced from 4.5 volts to 4.0 volts, further suppose that the current required for the store operation is 10 milliamperes, then from the expression $$Q = CV = iT,$$

where i denotes store current and store T time, the capacitance C of the capacitor 201 becomes $$C = \frac{10 \, (mA) \times 10 \, (mS)}{0.5 \, (V)} = 200 \, [\mu F]$$

The above-mentioned current of 10 milliamperes is an estimation, and in practice, a current of 1 milliampere is sufficient. Note, a capacitor having a capacitance of 20 microfarads can handle the above operation, but a capacitor having a capacitance of 100 microfarads can handle all operational requirements. In the above-mentioned example, a capacitor 200 is connected to a pin 12. In place for the capacitor 200, a lithium battery 201 may be connected thereto. In this case, it is not necessary to connect the transistor 24 thereto for charging up the capacitor 200.

The structure of the SRAMs and EEPROMs in the device of FIG. 1 is shown in FIG. 2. In FIG. 2, the memory portion 30 includes an operation mode selection control circuit 301, a booster circuit 302, a timer 303, a bit line load control circuit 304, a memory cell array 305 a decoder 306, an address buffer 307, a decoder 308, an address 309, an output/input buffer 310, a sense amplifier/input buffer 311, and a column gate 312.

Figure 3:
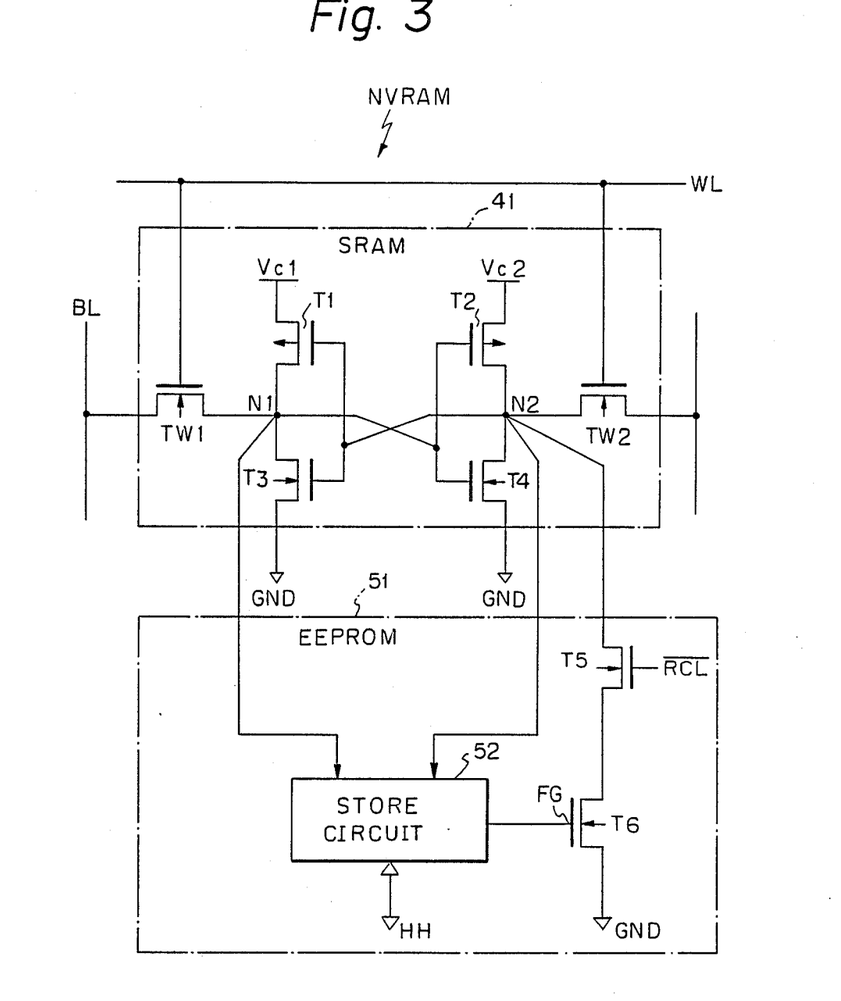
FIG. 3 is a circuit diagram of the structure of the NVRAM cell in the device of FIG. 1.

As shown in FIG. 3, an SRAM cell 41 is constituted by a flip-flip circuit which includes two P-channel type MOS transistors T1 and T2, two N-channel type MOS transistors T3 and T4 and two channel MOS transistors TW1 and TW2. BL and $\overline{BL}$ denote bit-lines and WL and $\overline{WL}$ word lines. The EEPROM cell 51, i.e., the nonvolatile memory cell, is constituted by a single MOS transistor T6 having a floating gate FG. The MOS transistor T5 is used in a recall operation and a recall signal is supplied to a gate thereof. A store circuit 52 is a circuit for storing data, and during a store operation, injects positive or negative charges to the floating gate FG of a transistor T6 in response to the "H" or"L" level of nodes N1 and N2. Accordingly, the writing of data to the nonvolatile memory cell transistor T6 is carried out by injecting the charge from the store circuit 52 to the floating gate FG. Therefore, the threshold level of the transistor T6 is changed and the transistor T6 is turned ON or OFF, in accordance with the state of the flip-flip circuit of the SRAM 41. In the circuit of the SRAM, separate power sources $V_{C1}$ and $V_{C2}$ are provided for the recall operation. Turning transistor T5 ON, an applied timing to the voltages $V_{C1}$ and $V_{C2}$ is postponed to carry out a recall operation.

Figure 4:
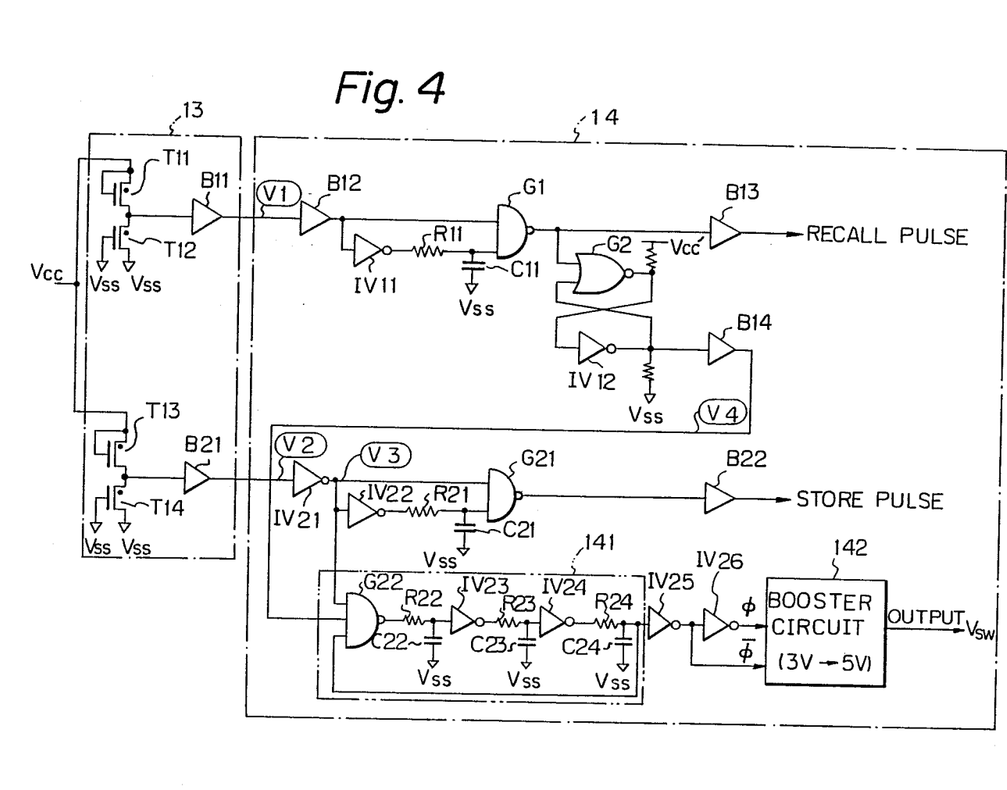
FIG. 4 is a circuit diagram of the V$_{CC}$ voltage sense circuit and the store/recall & power supply switching control circuit in the device of FIG. 1; and, FIG. 5 and FIG. 6 are line diagrams showing the generation of a recall pulse and a store pulse, respectively.
Figure 5:
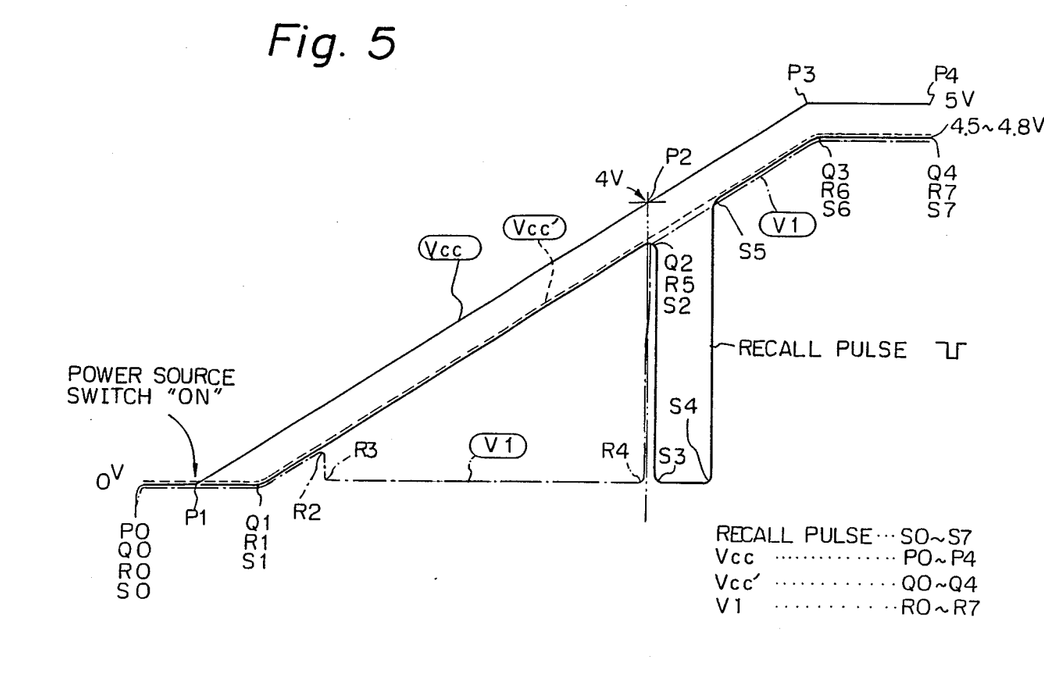
Figure 6:
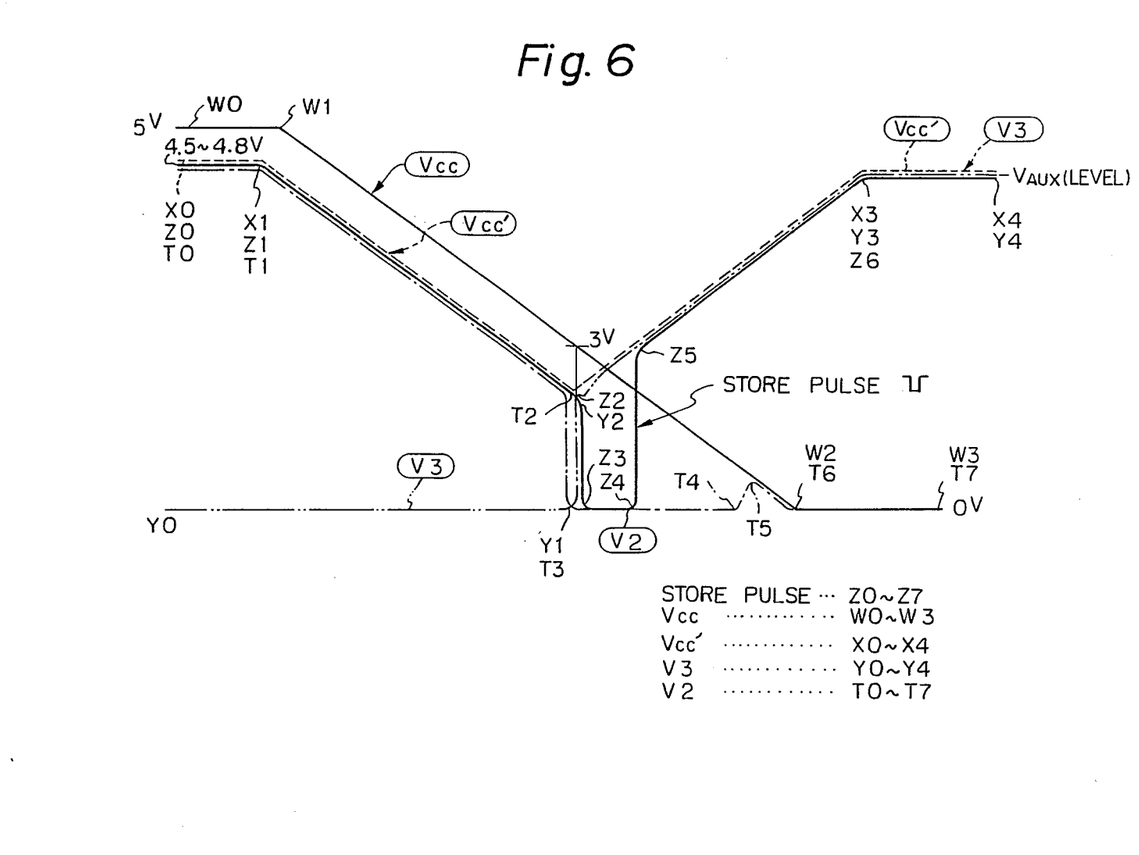

The structure of the $V_{CC}$ voltage sense circuit 13 and the store/recall & power source change-over control circuit 14 as shown in FIG. 2 is shown in detail in FIG. 4. Examples of the waveforms of the voltages V1, V2, and V3 in the circuit of FIG. 4 are shown in FIGS. 5 and 6.

In FIG. 4, the external positive side power source voltage $V_{CC}$ is supplied via the pin 11 to the depletion transistors T11 and T13.

T12 and T14 are also depletion type transistors. A series connected circuit of T11 and T12, and a series-connected circuit of T13 and T14 form a divider circuit, respectively. The conductance gm of T11 and T12 is designed in such a way that when the voltage $V_{CC}$ exceeds 4 V, the output of a buffer B11 may be inverted. On the other hand, the conductance gm of T13 and T14 is designed in such a way that when the voltage $V_{CC}$ reduces below 3 V, the output of the buffer B21 may be inverted.

The voltage V1 is fed to a buffer B12 and the output of the buffer B12 is sent, on one side to a NAND gate G1, and on the other side, to an inverter IV11, and then via a resistor R11 to another terminal of the NAND gate G1, where the multiplication of the resistor R11 and a capacitor C11 produces a time constant $C_{11}R_{11}$ for generating the recall width. The output of a NAND gate G1 is sent on one side to a buffer B13 and produces a recall pulse, and on the other side, to a NAND gate G2. Then, the output of the NAND gate G2 is sent to a gate G22 via an inverter IV12 and a buffer B14, to a second input of a NAND gate G22.

A NAND gate G2 and an inverter IV12 form a latch circuit. The output of the NND gate G1 latches the trailing from an H level to an L level and the output is at an H level. Therefore, after the voltage $V_{CC}$ surfaces 4 V, the output V4 of the buffer B14 is kept at an H level.

A ring oscillator 141 is composed of a NAND gate G22, inverters IV23 and IV24, resistors R22, R23, and R24, and capacitors C22, C23, and C24. The output of the ring oscillator 141 is fed back to the gate G22 as a third input.

When the voltage $V_{CC}$ surpasses 3 V, the output of an inverter IV21 is at an L level. On account of this, the feedback loop of the ring oscillator is cut off by a NAND gate G22. As a result, while the voltage $V_{CC}$ is at a normal value and when the voltage $V_{CC}$ rises up from zero volt, the ring oscillator does not oscillate.

When the voltage $V_{CC}$ falls down below 3 volts, the output of the inverter IV21 changes from an L level to an H level. As a result, the feedback loop is connected to the ring oscillator, the oscillation start to run.

The output of the ring oscillator 141 is sent to an inverter 25 and the output of the inverter 25 is, on one side, fed to a second input of a booster circuit 142, and on the other side, to a first input of the booster circuit 142 via an inverter IV26. In the booster circuit 142, the voltage $V_{CC}$ is boosted from 3 volts to 5 volts and the output of the booster circuit 142 is sent to the transistor 22 as a voltage $V_{SW}$. The reason why the above-noted boosting is necessary originates from the relation $V_{AUX} > 3$ volts.

When the voltage of $V_{SW}$ is $V_{AUX}$ and the boosting which makes higher than the value of $V_{AUX}$ is carried out, the transistor 22 can be completely turned ON. As a result, the transistor 22 is turned ON and the voltage of the capacitor 200 is supplied as $V_{CC}'$.

The output of the gate G21 is sent to an operation mode selection control circuit 301 as a store pulse.

Note that both the second input of the NAND gate G2 and the output of the inverter IV12, and both the output of the NAND gate G2 and the input of the inverter IV12, are cascade-connected, and further, the resistors R12 are connected to the output of the gate G2 and R13 connected to the output of the inverter IV12 in such a way that when the voltage of the internal power source $V_{CC}'$ rises, the voltage V4 kept low until the voltage rises from 0 volt to 4 volts to deactivate a ring oscillator.

In FIG. 5, when the power source is switched ON at a point P1, the voltage $V_{CC}$ is raised from 0 volt to 5 volts via a point of 4 volts P2 and the waveform is flat at points P3 and P4 of 5 volts. The voltage of $V_{CC}'$ raised from 0 volt to 4.5 through 4.8 volts, the values of which is ($V_{CC} - V_{TH}$), that is, a threshold voltage $V_{TH}$ is reduced from a positive side power source voltage $V_{CC}$. The value of $V_{CC}'$ starts from a point Q1 to a point Q3 via a point Q2 and reaches the value of ($V_{CC} - V_{TH}$) at points Q3 and Q4. When the voltage $V_{CC}$ is ON, the voltage $V_{CC}'$ responds to the voltage $V_{CC}$ and the voltage V, responds to the voltage $V_{CC}'$. When an abrupt step voltage V1 is produced, a corresponding step pulses v is generated to cut out the step waveform of V1. The waveform is traced by points S0, S1, S2–S6 and S7. In response to the generation of V1, a recall/pulse is generated.

In FIG. 6, when the power source is switched OFF, the voltage of $V_{CC}$ drops from 5 volts to 0 volt, and correspondingly, the voltage $V_{CC}'$ drops from 4.5 through 4.8 volts to a X2-point voltage and then rises to 4.5 through 4.8 volts at an X3-point together with the voltage of V3 and $V_{AUX}$.

In the case when a negative step pulse V2 is generated, a store pulse is produced in line with a set of points Z0 and Z7.

When a potential level L is raised to a potential level H and the potential level of V4 is H, a ring oscillator 141 starts to oscillate and $V_{SW}$ is boostered from 3 volts to 5 volts.

When the gate voltage of the transistor 22 (FIG. 1) is 5 volts, then current flows from a terminal $V_{AUX}$ 12 to a node 23 and the current of the internal power supply flows.

When the voltage V3 changes from an L level to an H level and the voltage V4 is an H level, the potential level of the power source is raised, at the voltage of 4 volts a potential level is set to an H level. Therefore, when the power source is switched ON and the voltage is 3 volts, then a potential level is at a Low state, so the booster circuit 142 does not carry out a boostering operation.

These are shown in FIGS. 5, 6 and 4. In FIG. 6 the tracing points of store corresponds to points Z0 to Z7, $V_{CC}$ to points W0 to W3, $V_{CC}'$ X4, V3 to points Y0 to Y4 and V2 to points T0 to T7.

I claim:

1. A semiconductor nonvolatile memory device comprising:
   a plurality of nonvolatile random access memory cells constituted by volatile memory cells and nonvolatile erasable programmable read only memory cells;
   a first terminal for receiving a power source voltage;
   a second terminal for receiving an auxiliary power source voltage;
   a sense circuit, connected to said first terminal, monitoring said power source voltage to generate both a first control signal, when the power source voltage reaches a normal range, and a second control signal, when the power source voltage falls out of the normal range;
   first switch means, connected between said first and second terminals, for supplying the power source voltage to said second terminal;
   second switch means, connected between said first terminal and said nonvolatile random access memory cells, for supplying the power source voltage;
   third switch means, connected between said second terminal and said nonvolatile random access memory cells, for supplying the auxiliary power source voltage; and
   control means, connected to said nonvolatile random access memory cells, said second switch means, and said sense circuit, for recalling data stored in the nonvolatile erasable programmable read only memory cells to the volatile memory cells in response to the first control signal and for storing data stored in the volatile memory cells to the nonvolatile memory erasable programmable read only memory cells in response to the second control signal, wherein said first and second switch means are turned off when the power source voltage falls down, and said third switch means is turned on in response to said second control signal.

2. A semiconductor nonvolatile memory device according to claim 1, wherein said first switch means include a first transistor, connected between said first and second terminals, having a gate connected to said first terminals;
   said second switch means include a second transistor, connected between said first terminal and said nonvolatile random access memory cells, having a gate connected to said first terminal; and
   said third switch means includes a third transistor, connected between said second terminal and said nonvolatile random access memory cells, having a gate connected to said control means.

3. A semiconductor nonvolatile memory device comprising:
- a memory cell array portion having a plurality of nonvolatile memory cells and a plurality of volatile memory cells;
- a first terminal for receiving a power source voltage;
- a second terminal for receiving an auxiliary power source voltage;
- sense circuit means, connected to said first terminal, for generating a first control signal when the power source voltage is larger than a first predetermined voltage, and generating a second control signal when the power source voltage is smaller than a second predetermined voltage;
- control circuit means, connected to said sense circuit means and said memory cell array portion, for controlling a data transfer from the nonvolatile memory cells to the volatile memory cells in response to the first control signal and a data transfer from the volatile memory cells to the nonvolatile memory cells in response to said second control signal; and
- switching means, connected to said first and second terminals and said memory cell array portion, for supplying the auxiliary power source voltage instead of the power source voltage to said memory cell array portion in response to the second control signal.

4. A semiconductor nonvolatile memory device according to claim 3, wherein the first predetermined voltage is larger than the second predetermined voltage.

5. A semiconductor nonvolatile memory device according to claim 3, wherein said switching means comprises a first transistor connected between said first terminal and said second terminal, a second transistor connected between said first terminal and said memory cell array portion, and a third transistor, connected between said second terminal and said memory cell array portion, said third transistor being turned on in response to the second control signal.

6. A semiconductor nonvolatile memory device according to claim 5, wherein said control circuit means comprises a voltage booster circuit activated by the second control signal for generating a boosted signal to turn on the third transistor.

7. A semiconductor nonvolatile memory device according to claim 5, wherein said switching means comprises a first transistor connected between said first terminal and said memory cell array portion, and a terminal second transistor, connected between said second terminal and said memory cell array portion, said second transistor being turned on in response to the second control signal.

8. A semiconductor nonvolatile memory device according to claim 7, wherein said control circuit means comprises a voltage booster circuit activated by the second control signal for generating a boosted signal to turn on the second transistor.

* * * * *